(12) United States Patent
Shibata et al.

(10) Patent No.: US 7,794,541 B2
(45) Date of Patent: Sep. 14, 2010

(54) GALLIUM NITRIDE-BASED MATERIAL AND METHOD OF MANUFACTURING THE SAME

(75) Inventors: Hiroyuki Shibata, Miyagi-ken (JP); Yoshio Waseda, Miyagi-ken (JP); Kenji Shimoyama, Ibaraki-ken (JP); Kazumasa Kiyomi, Ibaraki-ken (JP); Hirobumi Nagaoka, Ibaraki-ken (JP)

(73) Assignees: Tohoku University, Sendai-shi (JP); Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 12/282,961

(22) PCT Filed: Mar. 8, 2007

(86) PCT No.: PCT/JP2007/054591
§ 371 (c)(1),
(2), (4) Date: Sep. 15, 2008

(87) PCT Pub. No.: WO2007/119319
PCT Pub. Date: Oct. 25, 2007

(65) Prior Publication Data
US 2009/0081110 A1 Mar. 26, 2009

(30) Foreign Application Priority Data
Mar. 13, 2006 (JP) ............... 2006-067907
Mar. 6, 2007 (JP) ............... 2007-056353

(51) Int. Cl.
*C30B 23/00* (2006.01)
(52) U.S. Cl. ............... 117/84; 117/952; 423/409; 438/479; 438/481
(58) Field of Classification Search ............... 423/409; 117/84, 952; 438/479, 481
See application file for complete search history.

(56) References Cited

U.S. PATENT DOCUMENTS 6,159,287 A 12/2000 Solomon et al.

(Continued)

FOREIGN PATENT DOCUMENTS

JP 10012555 A * 1/1998

(Continued)

OTHER PUBLICATIONS

J. Zou, et al., "Thermal conductivity of GaN films: Effects of impurities and dislocations", Journal of Applied Physics, vol. 92, No. 5, Sep. 1, 2002, pp. 2534-2539.

(Continued)

*Primary Examiner*—Steven Bos
*Assistant Examiner*—Pritesh Darji
(74) *Attorney, Agent, or Firm*—Oblon, Spivak, McClelland, Maier & Neustadt, L.L.P.

(57) ABSTRACT

Disclosed is a method of manufacturing a GaN-based material having high thermal conductivity. A gallium nitride-based material is grown by HVPE (Hydride Vapor Phase Epitaxial Growth) by supplying a carrier gas (G1) containing $H_2$ gas, GaCl gas (G2), and $NH_3$ gas (G3) to a reaction chamber (10), and setting the growth temperature at 900 (° C.) (inclusive) to 1,200 (° C.) (inclusive), the growth pressure at $8.08 \times 10^4$ (Pa) (inclusive) to $1.21 \times 10^5$ (Pa) (inclusive), the partial pressure of the GaCl gas (G2) at $1.0 \times 10^4$ (Pa) (inclusive) to $1.0 \times 10^4$ (Pa) (inclusive), and the partial pressure of the $NH_3$ gas (G3) at $9.1 \times 10^2$ (Pa) (inclusive) to $2.0 \times 10^4$ (Pa) (inclusive).

18 Claims, 5 Drawing Sheets

U.S. PATENT DOCUMENTS

| | | |
|---|---|---|
| 6,946,308 B2 | 9/2005 | Hiramatsu et al. |
| 2003/0211710 A1 | 11/2003 | Hiramatsu et al. |
| 2006/0270200 A1 | 11/2006 | Shibata |

FOREIGN PATENT DOCUMENTS

| | | | |
|---|---|---|---|
| JP | 11265884 A | * | 9/1999 |
| JP | 2000-252217 | | 9/2000 |
| JP | 2001 181097 | | 7/2001 |
| JP | 2001335399 A | * | 12/2001 |
| JP | 2002 544109 | | 12/2002 |
| JP | 2003 78084 | | 3/2003 |
| JP | 2004 6568 | | 1/2004 |
| JP | 2004-39810 | | 2/2004 |
| JP | 2004-523450 | | 8/2004 |
| JP | 2005 119921 | | 5/2005 |
| JP | 2005-263609 | | 9/2005 |
| JP | 2007-217227 | | 8/2007 |
| WO | WO 02/44443 A1 | | 6/2002 |
| WO | 2006 003381 | | 1/2006 |

OTHER PUBLICATIONS

J. Bai, et al., "(0001) oriented GaN epilayer grown on (1120) sapphire by MOCVD", Journal of Crystal Growth, vol. 231, 2001, pp. 41-47.

K., sichel E. et al., "Thermal Conductivity of GaN, 25-360 K", J. Phys. Chem. Solids., Pergamon Press, vol. 38, p. 330, (1977).

Liu, Weili et al., "Increased thermal conductivity of free-standing low-dislocation-density GaN films", Phys. Stat. Sol. (a), Rapid Research Letters, vol. 202, No. I 12, pp. R135-R137, (2005).

"GaN Substrates Technology", CREE Materials, http://www.cree.com/products/gan_tech.htm, pp. 1-2 and 1, (2005).

Kawamura et al., Investigation of thermal conductivity of GaN by molecular dynamics, 2005, Journal of Crystal Growth, 284, 197-202.

Zhang et al., Electron cyclotron resonance etching characteristics of GaN in SiCI4/Ar, 1196, Appl. Phys. Lett., 68, 367-369.

* cited by examiner

GALLIUM NITRIDE-BASED MATERIAL AND METHOD OF MANUFACTURING THE SAME

TECHNICAL FIELD

The present invention relates to a gallium nitride-based material and a method of manufacturing the same and, more particularly, to a gallium nitride-based material manufacturing method using HVPE (Hydride Vapor Phase Epitaxial Growth) and a gallium nitride-based material that can be manufactured by the method.

BACKGROUND ART

To radiate heat generated by a semiconductor device, a heat sink is attached to the semiconductor device, or the semiconductor device is fixed to a heat sink with a submount made of a material having a high thermal conductivity being interposed between them.

Patent reference 1 describes that it is favorable to use GaN (gallium nitride) as the material of the heat sink or submount, and that the thermal conductivity of the material is preferably 100 to 300 (W/m·K) within the range of 0 to 200 (° C.). However, patent reference 1 does not disclose any practical method of manufacturing a GaN member having a thermal conductivity of 100 to 300 (W/m·K) within the range of 0 to 200 (° C.). Also, patent reference 1 does not describe that GaN having a thermal conductivity of 100 to 300 (W/m·K) was obtained.

Non-patent reference 1 describes the dependence of the thermal conductivity of GaN on the temperature. According to non-patent reference 1, the thermal conductivity of GaN is 1.7 (W/cm·K) at 300 (K).

Non-patent reference 2 describes that the thermal conductivity of oxygen-doped GaN was 225 (W/m-K) when measured at room temperature (the measurement method was the 3ω method). Non-patent reference 2 also describes that the theoretical limit of the thermal conductivity of an ideal GaN crystal is 410 (W/m·K).

Non-patent reference 3 describes that the thermal conductivity of a GaN substrate manufactured by Cree is 220 (W/m·K) at room temperature (the measurement method is the laser flash method).

Patent reference 1: Japanese Patent Laid-Open No. 2003-78084

Non-patent reference 1: J. Phys. Chem. Solids, 1977, Vol. 38, p. 330

Non-patent reference 2: phys. Stat. sol. (a) 202, No. 12, R135-R137 (2005)

Non-patent reference 3: [Searched Dec. 22, 2005], Internet <URL:http://www.cree.com/products/gan_tech.htm>

DISCLOSURE OF INVENTION

Problems that the Invention is to Solve

A heat transmitting member used as a heat sink or submount of a semiconductor device made of a GaN-based material is preferably made of a GaN-based material in order to suppress the stress generated by the difference between the thermal expansion coefficients of the semiconductor device and heat transmitting member. When forming the heat sink or submount by using a GaN-based material, for example, the GaN-based material desirably has a high thermal conductivity of at least 250 (W/m·K) or more, and more desirably, 280 (W/m·K) or more. As described previously, however, even the best of the presently existing GaN-based materials has a thermal conductivity of at most 225 (W/m·K) at room temperature.

A GaN-based material having a high thermal conductivity is usefully applicable to a portion supporting an active layer of a semiconductor device (e.g., to a multilayered structural portion including a substrate or active layer). The use of a GaN-based material like this makes it possible to efficiently move heat generated in the active layer outside.

The present invention has been made in consideration of the above situation, and has as its object to provide a method of manufacturing a GaN-based material having a high thermal conductivity, provide a GaN-based material manufactured by the method, and provide a member such as a substrate, heat sink, or submount made of the GaN-based material.

Means of Solving the Problems

The first aspect of the present invention relates to a method of manufacturing a gallium nitride-based material or gallium nitride material, and the manufacturing method includes a growth step of growing a gallium nitride-based material by HVPE (Hydride Vapor Phase Epitaxial Growth). In the growth step, a carrier gas containing $H_2$ gas, GaCl gas, and $NH_3$ gas are supplied to a reaction chamber, the growth temperature is set at 900 (° C.) (inclusive) to 1,200 (° C.) (inclusive), the growth pressure is set at $8.08 \times 10^4$ (Pa) (inclusive) to $1.21 \times 10^5$ (Pa) (inclusive), the partial pressure of the GaCl gas is set at $1.0 \times 10^2$ (Pa) (inclusive) to $1.0 \times 10^4$ (Pa) (inclusive), and the partial pressure of the $NH_3$ gas is set at $9.1 \times 10^2$ (Pa) (inclusive) to $2.0 \times 10^4$ (Pa) (inclusive).

According to a preferred embodiment of the present invention, the carrier gas may practically be made of $H_2$ gas alone.

According to a preferred embodiment of the present invention, the carrier gas may further contain $N_2$ gas in addition to $H_2$ gas. In this case, the supply of the carrier gas is adjusted such that ($H_2$ gas partial pressure)/(($H_2$ gas partial pressure)+ ($N_2$ gas partial pressure)) is preferably 0.1 (inclusive) to 1 (exclusive), more preferably 0.6 (inclusive) to 1 (exclusive), and most preferably 0.7 (inclusive) to 1 (exclusive).

According to a preferred embodiment of the present invention, a support configured to support an underlying substrate is preferably placed in the reaction chamber, a gallium nitride-based material is preferably grown on the underlying substrate in the growth step, and a supply chamber configured to communicate with the reaction chamber preferably supplies the carrier gas, the GaCl gas, and the $NH_3$ gas to the reaction chamber. The average sectional area of the supply chamber is desirably smaller than that of the reaction chamber, and the average sectional area of the supply chamber is more desirably ⅔ or less the average sectional area of the reaction chamber. Under the conditions, the flow rate of the carrier gas in the supply chamber is favorably 0.3 (m/min) (inclusive) to 2.5 (m/min) (inclusive), and more favorably 0.5 (m/min) (inclusive) to 1.7 (m/min) (inclusive).

According to a preferred embodiment of the present invention, a support configured to support an underlying substrate on a supporting surface is preferably placed in the reaction chamber, a gallium nitride-based material is preferably grown on the underlying substrate in the growth step, and a supply chamber configured to communicate with the reaction chamber preferably supplies the carrier gas, the GaCl gas, the $NH_3$ gas to the reaction chamber, the average sectional area of the supply chamber is desirably smaller than the sectional area of the reaction chamber in a section including the supporting surface, and the average sectional area of the supply chamber is more desirably ⅔ or less the sectional area of the reaction chamber in the section including the supporting surface. Under the conditions, the flow rate of the carrier gas in the supply chamber is favorably 0.3 (m/min) (inclusive) to 2.5 (m/min) (inclusive), and more favorably 0.5 (m/min) (inclusive) to 1.7 (m/min) (inclusive).

According to a preferred embodiment of the present invention, the supply of the carrier gas is preferably adjusted such that ($H_2$ gas partial pressure)/(($H_2$ gas partial pressure)+($N_2$ gas partial pressure)) is 0.1 (inclusive) to 1 (exclusive), a support configured to support an underlying substrate is preferably placed in the reaction chamber, a gallium nitride-based material is preferably grown on the underlying substrate in the growth step, a supply chamber configured to communicate with the reaction chamber preferably supplies the carrier gas, the GaCl gas, and the $NH_3$ gas to the reaction chamber, the sectional area of the supply chamber is desirably smaller than that of the reaction chamber, and the flow rate of the carrier gas in the supply chamber is favorably 0.3 (m/min) (inclusive) to 2.5 (m/min) (inclusive), and more favorably 0.5 (m/min) (inclusive) to 1.7 (m/min) (inclusive).

The second aspect of the present invention relates to a gallium nitride-based material or gallium nitride material, and the material has a thermal conductivity of $2.8 \times 10^2$ (W/m·K) or more at 25 (° C.).

The third aspect of the present invention relates to a gallium nitride-based material or gallium nitride material, and the material has a thermal conductivity of $3.0 \times 10^2$ (W/m·K) or more at 25 (° C.).

The fourth aspect of the present invention relates to a gallium nitride-based material or gallium nitride material, and the material has a thermal conductivity of $3.0 \times 10^2$ (W/m·K) (inclusive) to $3.8 \times 10^2$ (W/m·K) (inclusive) at 25 (° C.).

The fifth aspect of the present invention relates to a gallium nitride-based material or gallium nitride material, and the material has a thermal conductivity of $3.3 \times 10^2$ (W/m·K) (inclusive) to $3.8 \times 10^2$ (W/m·K) (inclusive) at 25 (° C.).

The sixth aspect of the present invention relates to a gallium nitride-based material or gallium nitride material, and the material has a thermal conductivity of $3.5 \times 10^2$ (W/m·K) (inclusive) to $3.8 \times 10^2$ (W/m·K) (inclusive) at 25 (° C.).

The seventh aspect of the present invention relates to a gallium nitride-based material or gallium nitride material, and the material has a (002)-plane X-ray rocking curve half-width of 300 (arcsec) or less.

The eighth aspect of the present invention relates to a gallium nitride-based material or gallium nitride material, and the material has a (102)-plane X-ray rocking curve half-width of 500 (arcsec) or less.

The ninth aspect of the present invention relates to a gallium nitride-based material or gallium nitride material, and the material has an oxygen concentration of less than $5 \times 10^{17}$ (atoms/cm$^3$).

The 10th aspect of the present invention relates to a gallium nitride-based material or gallium nitride material, and the material has a carbon concentration of less than $1 \times 10^{17}$ (atoms/cm$^3$).

The 11th aspect of the present invention relates to a gallium nitride-based material or gallium nitride material, and the material has a hydrogen concentration of less than $1 \times 10^{18}$ (atoms/cm$^3$).

The 12th aspect of the present invention relates to a substrate, a submount, a heat sink, or another member (e.g., a heat transmitting member), and the member contains the gallium nitride-based material or gallium nitride material described above.

EFFECTS OF THE INVENTION

The present invention can provide, for example, a GaN-based material having a high thermal conductivity and an applied product of the material.

EXPLANATION OF REFERENCE NUMERALS

Figure 1:
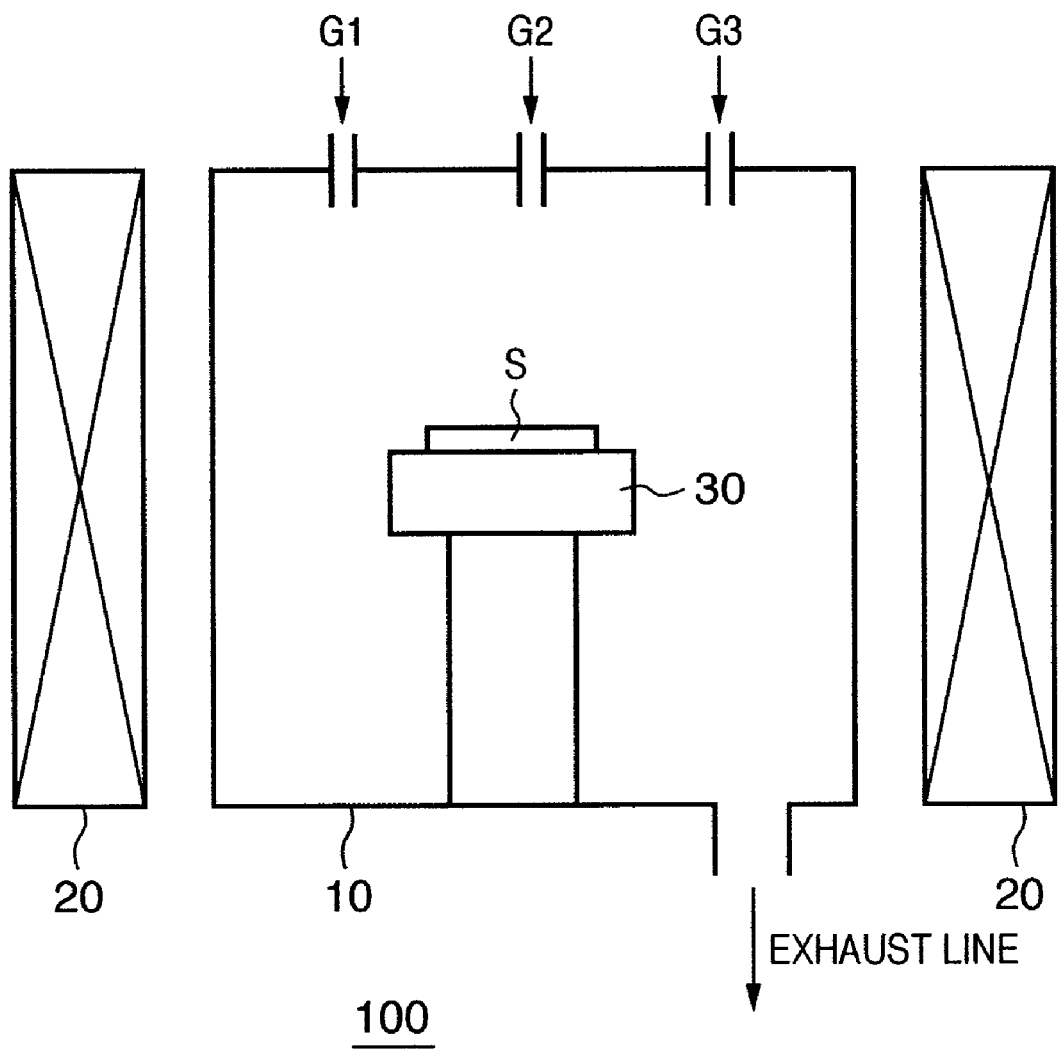
FIG. 1 is a view showing an outline of the arrangement of an HVPE apparatus suitable for a method of manufacturing a GaN-based material of the present invention.

100 . . . HVPE apparatus
10 . . . reaction chamber
20 . . . heater
30 . . . substrate support
30S . . . supporting surface
40 . . . supply chamber
S . . . underlying substrate
G1 . . . carrier gas
G2 . . . GaCl gas
G3 . . . $NH_3$ gas
200, 300 . . . semiconductor product
210 . . . semiconductor device
212 . . . substrate
214 . . . multilayered structure
230 . . . submount
240 . . . heat sink
250 . . . heat sink

BEST MODE FOR CARRYING OUT THE INVENTION

Preferred embodiments of the present invention will be explained below with reference to the accompanying drawings.

A gallium nitride (GaN)-based material manufacturing method according to a preferred embodiment of the present invention includes a growth step of growing a gallium nitride-based material by HVPE (Hydride Vapor Phase Epitaxial Growth). The gallium nitride (GaN)-based material is a III-V compound semiconductor material containing mainly gallium nitride (GaN). The material contains mostly gallium (Ga) as a group-III element, and nitrogen (N) as a group-V element. Also, the material includes a gallium nitride-based material in which a P- or N-type impurity is doped in order to adjust the conductivity type.

The GaN-based material is formed on, for example, a GaN substrate, a substrate having layers including a GaN layer, or a substrate such as a sapphire substrate. In this specification, "a second element (e.g., a member or layer) is formed or placed on a first element (e.g., a substrate, member, or layer)"

includes the case where the second element is formed or placed on the first element such that the second element is in contact with the first element, and the case where the second element is formed or placed on one or a plurality of third elements (e.g., members or layers) on the first element.

Figure 5:
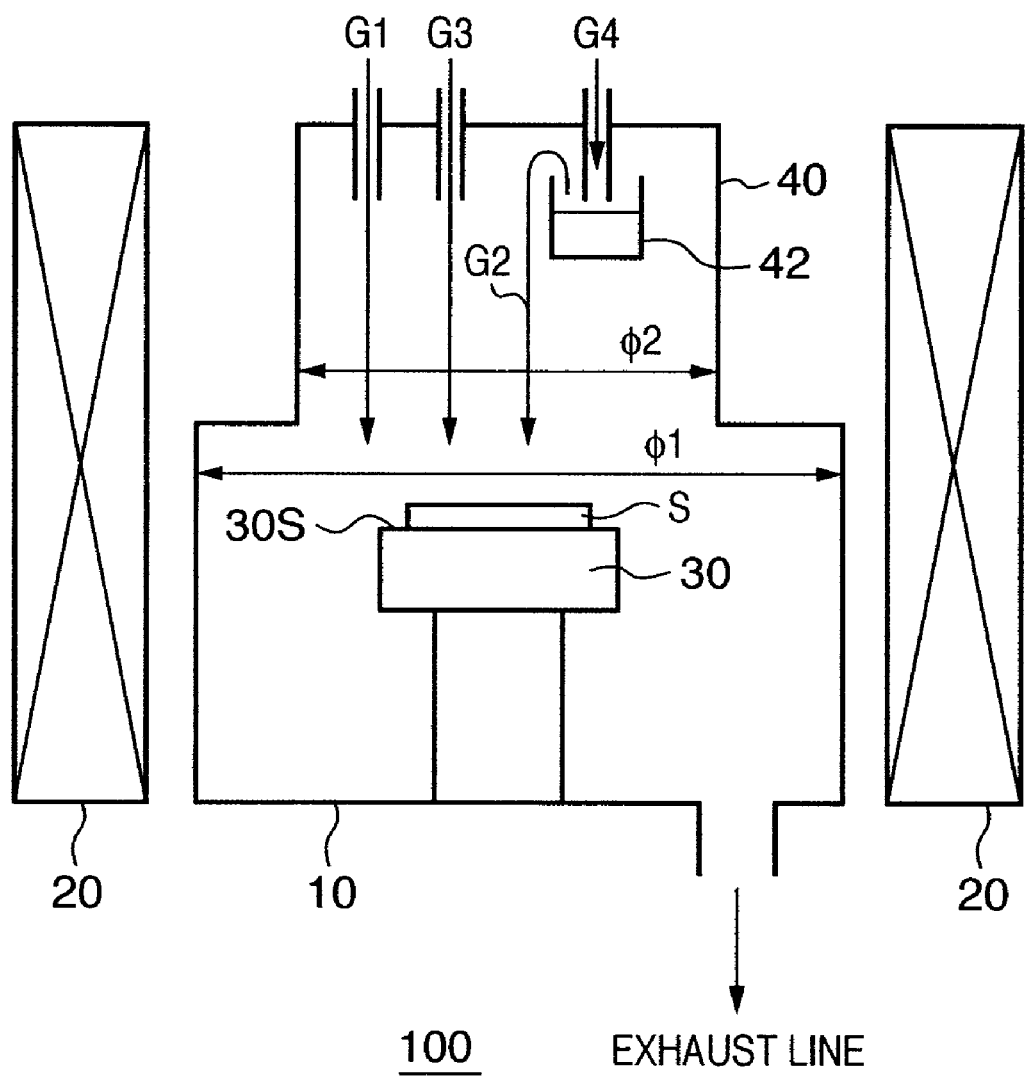
FIG. 5 is a view showing the arrangement of the HVPE apparatus shown in FIG. 1 in more detail.

FIG. 1 is a view showing an outline of the arrangement of an HVPE apparatus suitable for the GaN-based material manufacturing method of the present invention. FIG. 5 is a view showing the arrangement of the HVPE apparatus shown in FIG. 1 in more detail. An HVPE apparatus 100 can be constructed as a vertical HVPE apparatus. The vertical HVPE apparatus can form a laminar flow more easily than a horizontal HVPE apparatus, and hence is suited to forming a high-quality, high-uniformity epitaxially grown film with a high reproducibility. The vertical HVPE apparatus is also advantageous in batch processing (simultaneous growth on a number of substrates).

The HVPE apparatus 100 can comprise a reaction chamber 10, a substrate support 30 placed in the reaction chamber 10 to support an underlying substrate (a substrate on which a GaN-based material is to be grown) S on a supporting surface 30S, a supply chamber 40 constructed to communicate with the reaction chamber 10, and a heater 20. A carrier gas G1, $NH_3$ gas G3, and HCl gas G4 can be supplied to the supply chamber 40. A vessel 42 containing liquid Ga is placed in the supply chamber 40. The HCl gas G4 supplied into the supply chamber 40 generates GaCl gas G2 by reacting with the liquid Ga in the vessel 42. The supply chamber 40 can supply the carrier gas G1, GaCl gas G2, and $NH_3$ gas G3 into the reaction chamber 10. The carrier gas G1 contains at least $H_2$ gas. The carrier gas G1 may also contain $N_2$ gas in addition to $H_2$ gas.

The average sectional area of the supply chamber 40 is preferably smaller than that of the reaction chamber 10, and the average sectional area of the supply chamber 40 is more preferably ⅔ or less the average sectional area of the reaction chamber 10. In other words, the average sectional area of the supply chamber 40 is desirably smaller than the sectional area of the reaction chamber 10 in a section including the supporting surface 30S, and the average sectional area of the supply chamber 40 is more desirably ⅔ or less the sectional area of the reaction chamber 10 in the section including the supporting surface 30S. In this apparatus configuration, the flow rates of the carrier gas G1, GaCl gas G2, and $NH_3$ gas in the supply chamber 40 can be made higher than those of these gases in the reaction chamber 10. Since this reduces the amount of gases or particles flowing from the inner wall to the center of the supply chamber 40, it is possible to reduce the possibility that an impurity such as oxygen (O) or silicon (Si) that can leave the inner wall of the supply chamber 40 is entrapped in a film of a gallium nitride-based material formed on the underlying substrate S. Also, in the apparatus configuration as described above, in a portion where a gas flows from the supply chamber 40 to the reaction chamber 10, the gas readily flows radially from the center to the outside. This also makes it possible to reduce the possibility that the impurity such as oxygen (O) or silicon (Si) that can leave the inner wall of the supply chamber 40 is entrapped in the film of the gallium nitride-based material formed on the underlying substrate S. From the foregoing, a high-quality gallium nitride-based material having a limited impurity concentration, particularly, a gallium nitride-based material having a high thermal conductivity is presumably obtained by adopting the arrangement in which the average sectional area of the supply chamber 40 is smaller than that of the reaction chamber 10, preferably, the average sectional area of the supply chamber 40 is ⅔ or less the average sectional area of the reaction chamber 10, or the arrangement in which the average sectional area of the supply chamber 40 is smaller than the sectional area of the reaction chamber 10 in the section including the supporting surface 30S, preferably, the average sectional area of the supply chamber 40 is ⅔ or less the sectional area of the reaction chamber 10 in the section including the supporting surface 30S. The flow rate of the carrier gas G1 in the supply chamber 40 is desirably 0.3 (m/min) (inclusive) to 2.5 (m/min) (inclusive), and more desirably 0.5 (m/min) (inclusive) to 1.7 (m/min) (inclusive). The flow rate of the carrier gas in the reaction chamber 10 can roughly be calculated based on the ratio of the sectional area of the supply chamber 40 to that of the reaction chamber 10.

Oxygen or silicon is readily produced when the inner wall of the reaction chamber 10 or supply chamber 40 is made of quartz. While a gallium nitride-based material is grown, a polycrystal of this gallium nitride-based material can be deposited on the inner wall of the reaction chamber 10 or supply chamber 40. In this case, the gallium nitride-based material is deposited on the quartz inner wall of the reaction chamber 10 or supply chamber 40 so as to enter the structure of the quartz inner wall. This damages the quarts inner wall and, for example, produces fine scratches in it. If this deposit is removed by an etching gas (e.g., HCl gas), the fine scratches may generate quartz particles. If the quartz particles are thus generated, oxygen or silicon may be mixed in a film of the gallium nitride-based material while the film is grown on the underlying substrate.

The growth step of growing a gallium nitride-based material can be performed by supplying the carrier gas G1, GaCl gas G2, and $NH_3$ gas G3 from the supply chamber 40 to the underlying substrate S in the reaction chamber 10, and setting the growth temperature at 900 (° C.) (inclusive) to 1,200 (° C.) (inclusive), the growth pressure at $8.08 \times 10^4$ (Pa) (inclusive) to $1.21 \times 10^5$ (Pa) (inclusive), the partial pressure of the GaCl gas G2 at $1.0 \times 10^2$ (Pa) (inclusive) to $1.0 \times 10^4$ (Pa) (inclusive), and the partial pressure of the $NH_3$ gas G3 at $9.1 \times 10^2$ (Pa) (inclusive) to $2.0 \times 0$ (Pa) (inclusive). Note that the partial pressure of the carrier gas G1 is the value obtained by subtracting the partial pressures of the GaCl gas G2 and $NH_3$ gas G3 from the growth pressure.

Although the growth temperature can be set at 900 (° C.) (inclusive) to 1,200 (° C.) (inclusive) as described above, the growth temperature is preferably 950 (° C.) (inclusive) to 1,150 (° C.) (inclusive), and more preferably 1,000 (° C.) (inclusive) to 1,100 (° C.) (inclusive).

Although the growth pressure can be set at $8.08 \times 10^4$ (Pa) (inclusive) to $1.21 \times 10^5$ (Pa) (inclusive) as described above, the growth pressure is favorably $9.09 \times 10^4$ (Pa) (inclusive) to $1.11 \times 10^5$ (Pa) (inclusive), and more favorably $9.60 \times 10^4$ (Pa) (inclusive) to $1.06 \times 10^5$ (Pa) (inclusive).

The partial pressure of the GaCl gas G2 can be set at $1.0 \times 10^2$ (Pa) (inclusive) to $1.0 \times 10^4$ (Pa) (inclusive) as described above, but the partial pressure of the GaCl gas G2 is desirably $2.0 \times 10^2$ (Pa) (inclusive) to $5.6 \times 10^3$ (Pa) (inclusive), and more desirably $4.0 \times 10^2$ (Pa) (inclusive) to $4.0 \times 10^3$ (Pa) (inclusive).

The partial pressure of the $NH_3$ gas G3 can be set at $9.1 \times 10^2$ (Pa) (inclusive) to $2.0 \times 10^4$ (Pa) (inclusive) as described above, but the partial pressure of the $NH_3$ gas G3 is desirably $1.5 \times 10^3$ (Pa) (inclusive) to $1.5 \times 10^4$ (Pa) (inclusive), and more desirably $2.0 \times 10^3$ (Pa) (inclusive) to $1.0 \times 10^4$ (Pa) (inclusive).

When the carrier gas G1 contains $N_2$ gas in addition to $H_2$ gas, ($H_2$ gas partial pressure)/(($H_2$ gas partial pressure)+($N_2$ gas partial pressure)) can be set, for example, at 0.05 (inclusive) to 1 (exclusive), is preferably 0.1 (inclusive) to 1 (exclusive), 0.6 (inclusive) to 1 (exclusive), 0.7 (inclusive) to 1

(exclusive), and 0.8 (inclusive) to 1 (exclusive) in this order, and is most preferably 0.9 (inclusive) to 1 (exclusive).

A GaN material having a thermal conductivity of $2.8 \times 10^2$ (W/m·K) or more at 25 (° C.) can be obtained by performing the growth step by supplying the carrier gas G1 containing $H_2$ gas and $N_2$ gas such that ($H_2$ gas partial pressure)/(($H_2$ gas partial pressure)+($N_2$ gas partial pressure)) is 0.05 (inclusive) to 1 (exclusive), the GaCl gas G2, and the $NH_3$ gas G3 from the supply chamber 40 to the reaction chamber 10, and setting the growth temperature at 900 (° C.) (inclusive) to 1,200 (° C.) (inclusive), the growth pressure at $8.08 \times 10^4$ (Pa) (inclusive) to $1.21 \times 10^5$ (Pa) (inclusive), the partial pressure of the GaCl gas G2 at $1.0 \times 10^2$ (Pa) (inclusive) to $1.0 \times 10^4$ (Pa) (inclusive), and the partial pressure of the $NH_3$ gas G3 at $9.1 \times 10^2$ (Pa) (inclusive) to $2.0 \times 10^4$ (Pa) (inclusive).

When the growth step is performed by supplying the carrier gas G1 containing $H_2$ gas and $N_2$ gas such that ($H_2$ gas partial pressure)/(($H_2$ gas partial pressure)+($N_2$ gas partial pressure)) is 0.1 (inclusive) to 1 (exclusive), the GaCl gas G2, and the $NH_3$ gas G3 from the supply chamber. 40 to the reaction chamber 10, and setting the growth temperature at 900 (° C.) (inclusive) to 1,200 (° C.) (inclusive), the growth pressure at $8.08 \times 10^4$ (Pa) (inclusive) to $1.21 \times 10^5$ (Pa) (inclusive), the partial pressure of the GaCl gas G2 at $1.0 \times 10^2$ (Pa) (inclusive) to $1.0 \times 10^4$ (Pa) (inclusive), and the partial pressure of the $NH_3$ gas G3 at $9.1 \times 10^2$ (Pa) (inclusive) to $2.0 \times 10^4$ (Pa) (inclusive), it is possible to obtain a GaN material having a thermal conductivity of $3.0 \times 10^2$ (W/m·K) or more, more accurately, 306 (W/m·K) or more at 25 (° C.), a (002)-plane X-ray rocking curve half-width of 300 (arcsec) or less, a (102)-plane X-ray rocking curve half-width of 500 (arcsec) or less, an oxygen concentration of less than $5 \times 10^{17}$ (atoms/cm³), a silicon concentration of $5 \times 10^{17}$ (atoms/cm³) or less, a carbon concentration of less than $1 \times 10^{17}$ (atoms/cm³) and a hydrogen concentration of less than $1 \times 10^{18}$ (atoms/cm³)). Note that these impurity concentrations can be measured by SIMS (Secondary Ion Mass Spectroscopy).

When the growth step is performed by supplying the carrier gas G1 containing $H_2$ gas and $N_2$ gas such that ($H_2$ gas partial pressure)/(($H_2$ gas partial pressure)+($N_2$ gas partial pressure)) is 0.7 (inclusive) to 1 (exclusive), the GaCl gas G2, and the $NH_3$ gas G3 from the supply chamber 40 to the reaction chamber 10, and setting the growth temperature at 900 (° C.) (inclusive) to 1,200 (° C.) (inclusive), the growth pressure at $8.08 \times 10^4$ (Pa) (inclusive) to $1.21 \times 10^5$ (Pa) (inclusive), the partial pressure of the GaCl gas G2 at $1.0 \times 10^2$ (Pa) (inclusive) to $1.0 \times 10^4$ (Pa) (inclusive), and the partial pressure of the $NH_3$ gas G3 at $9.1 \times 10^2$ (Pa) (inclusive) to $2.0 \times 10^4$ (Pa) (inclusive), it is possible to obtain a GaN material having a thermal conductivity of $3.3 \times 10^2$ (W/m·K) or more, more accurately, 327 (W/m·K) or more at 25 (° C.), a (002)-plane X-ray rocking curve half-width of 300 (arcsec) or less, a (102)-plane X-ray rocking curve half-width of 500 (arcsec) or less, an oxygen concentration of less than $5 \times 10^{17}$ (atoms/cm³), a silicon concentration of $5 \times 10^{17}$ (atoms/cm³) or less, a carbon concentration of less than $1 \times 10^{17}$ (atoms/cm³) and a hydrogen concentration of less than $1 \times 10^{18}$ (atoms/cm³)).

To make the gallium nitride-based material or gallium nitride material conductive, it is preferable to intentionally dope silicon (in the case of n-type) or the like. On the other hand, if no high-impurity material is necessary, it is preferable to intentionally dope no impurity (undope any impurity). Also, as described in non-patent reference 2, a sample in which no impurity is intentionally doped is favorable because the sample has a thermal conductivity higher than that of a sample in which an impurity is intentionally doped. Examples of the impurity are oxygen, silicon, carbon, and hydrogen. A desirable impurity concentration of a sample in which no impurity is intentionally doped is as follows.

In a sample in which no oxygen is intentionally doped as an impurity, the oxygen concentration is preferably less than $1 \times 10^{17}$ (atoms/cm³), more preferably less than $5 \times 10^{16}$ (atoms/cm³), and further preferably less than $2 \times 10^{16}$ (atoms/cm³). Note that the SIMS lower detection limit of oxygen is $2 \times 10^{16}$ (atoms/cm³).

In a sample in which no carbon is intentionally doped as an impurity, the carbon concentration is preferably less than $5 \times 10^{16}$ (atoms/cm³), more preferably less than $3 \times 10^{16}$ (atoms/cm³), and further preferably less than $1 \times 10^{16}$ (atoms/cm³). Note that the SIMS lower detection limit of carbon is $1 \times 10^{16}$ (atoms/cm³).

In a sample in which no hydrogen is intentionally doped as an impurity, the hydrogen concentration is preferably $5 \times 10^{17}$ (atoms/cm³) or less, more preferably $3 \times 10^{17}$ (atoms/cm³) or less, and further preferably less than $1 \times 10^{17}$ (atoms/cm³). Note that the SIMS lower detection limit of hydrogen is $1 \times 10^{17}$ (atoms/cm³).

In a sample in which no silicon is intentionally doped as an impurity, the silicon concentration is preferably $1 \times 10^{17}$ (atoms/cm³) or less, more preferably $5 \times 10^{16}$ (atoms/cm³) or less, further preferably $5 \times 10^{15}$ (atoms/cm³) or less, and most preferably $1 \times 10^{15}$ (atoms/cm³) or less. Note that the SIMS lower detection limit of silicon is $1 \times 10^{15}$ (atoms/cm³).

When the growth step is performed by supplying the carrier gas G1 practically containing only $H_2$, the GaCl gas G2, and the $NH_3$ gas G3 from the supply chamber 40 to the reaction chamber 10, and setting the growth temperature at 1,000 (° C.), the growth pressure at $1.01 \times 10^5$ (Pa), the partial pressure of the GaCl gas G2 at $1.11 \times 10^3$ (Pa), and the partial pressure of the $NH_3$ gas G3 at $4.45 \times 10^3$ (Pa), it is possible to obtain a GaN material having a thermal conductivity of $3.5 \times 10^2$ (W/m·K), more accurately, 345 (W/m·K) at 25 (° C.), and having an oxygen concentration of less than $2 \times 10^{16}$ (atoms/cm³), a carbon concentration of less than $2 \times 10^{16}$ (atoms/cm³), and a hydrogen concentration of less than $1 \times 10^{17}$ (atoms/cm³), that is, having oxygen, carbon, and hydrogen concentrations less than the lower detection limits.

When the growth step is performed by supplying the carrier gas G1 practically containing only $H_2$, the GaCl gas G2, and the $NH_3$ gas G3 from the supply chamber 40 to the reaction chamber 10, and setting the growth temperature at 1,100 (° C.), the growth pressure at $1.01 \times 10^5$ (Pa), the partial pressure of the GaCl gas G2 at $1.11 \times 10^3$ (Pa), and the partial pressure of the $NH_3$ gas G3 at $4.45 \times 10^3$ (Pa), it is possible to obtain a GaN material having a thermal conductivity of $3.7 \times 10^2$ (W/m·K), more accurately, 371 (W/m·K) at 25 (° C.), and having an oxygen concentration of less than $2 \times 10^{16}$ (atoms/cm³), a carbon concentration of less than $2 \times 10^{16}$ (atoms/cm³), and a hydrogen concentration of less than $1 \times 10^{17}$ (atoms/cm³), that is, having oxygen and hydrogen concentrations less than the lower detection limits.

When the growth step is performed by supplying the carrier gas G1 practically containing only $H_2$, the GaCl gas G2, and the $NH_3$ gas G3 from the supply chamber 40 to the reaction chamber 10, and setting the growth temperature at 1,070 (° C.), the growth pressure at $1.01 \times 10^5$ (Pa), the partial pressure of the GaCl gas G2 at $1.11 \times 10^3$ (Pa), and the partial pressure of the $NH_3$ gas G3 at $4.45 \times 10^3$ (Pa), it is possible to obtain a GaN material having a thermal conductivity of $3.8 \times 10^2$ (W/m·K), more accurately, 380 (W/m·K) at 25 (° C.), a (002)-plane X-ray rocking curve half-width of 62.0 (arcsec), and a (102)-plane X-ray rocking curve half-width of 98.9 (arcsec), and having an oxygen concentration of less than $2 \times 10^{16}$ (atoms/cm³), a carbon concentration of less than $1 \times 10^{16}$ (atoms/ cm$^3$) and a hydrogen concentration of less than 1×10$^{17}$ (atoms/cm$^3$), that is, having oxygen, carbon, and hydrogen concentrations less than the lower detection limits.

When the GaN-based material is a single crystal, the X-ray rocking curve shows a single peak, and the crystallinity improves as the half-width decreases. The (002)-plane X-ray rocking curve half-width of the GaN-based material is preferably 300 (arcsec) or less, more preferably 200 (arcsec) or less, and further preferably 100 (arcsec) or less. Under the conditions described above, it is possible to obtain a GaN-based material having a (002)-plane X-ray rocking curve half-width of 62.0 (arcsec).

The (102)-plane X-ray rocking curve half-width of the GaN-based material is preferably 300 (arcsec) or less, more preferably 200 (arcsec) or less, and further preferably 100 (arcsec) or less. Under the conditions described above, it is possible to obtain a GaN-based material having a (102)-plane X-ray rocking curve half-width of 98.9 (arcsec).

The thermal conductivity described above was evaluated in accordance with the laser flash method. To directly obtain the thermal conductivity, it is necessary to prepare a large sample and perform measurement over a long time period. In the laser flash method, a thermal diffusivity α is measured by the laser flash method, and a thermal conductivity λ is calculated in accordance with equation (1) from a density ρ and specific heat capacitance $C_p$ obtained by another method.

$$\lambda = \alpha \times \rho \times C_p \tag{1}$$

Figure 2:
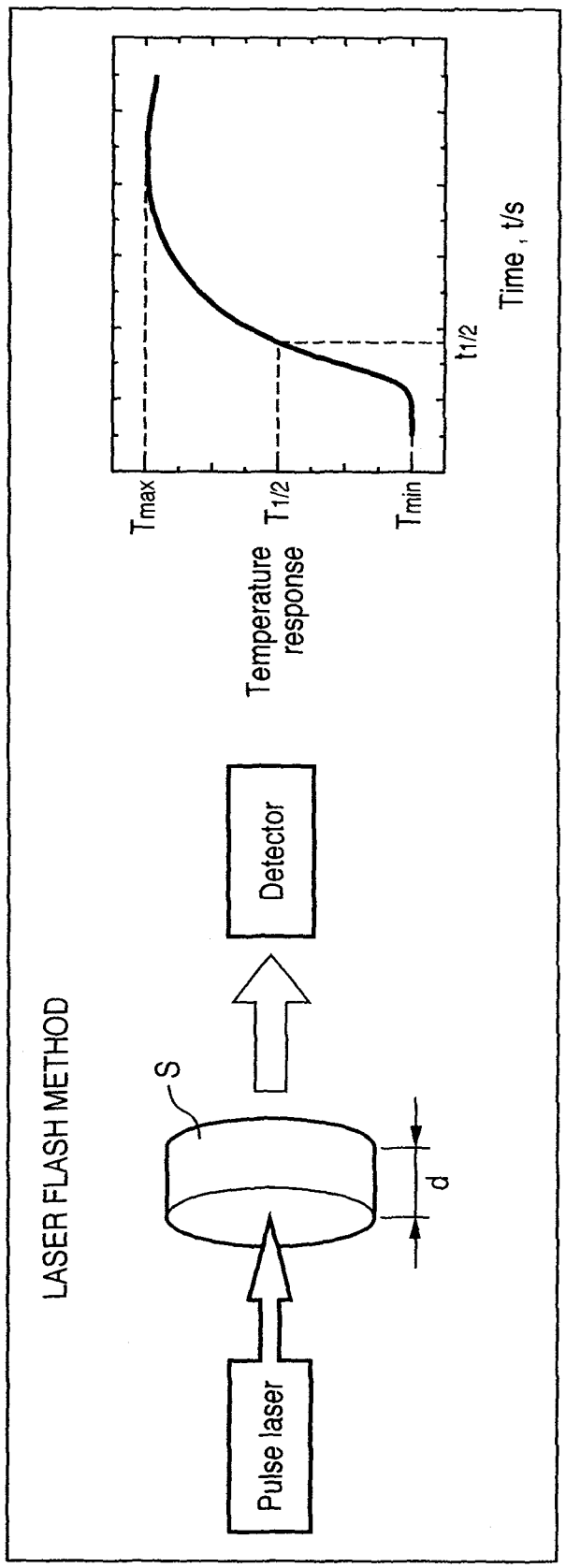
FIG. 2 is a view for explaining the laser flash method.

As shown in FIG. 2, the laser flash method is a measurement method of calculating the thermal diffusivity from the change in temperature on the back surface of a disk-like sample S having a diameter of 10 (mm) and a thickness of about 1 to 5 (mm), after evenly heating the front surface of the sample S with a laser beam having a pulse width of a few hundred μs. According to a theoretical solution assuming the heat insulating conditions, the back-surface temperature of the sample S heated with pulses rises as shown in FIG. 2, and converges to a predetermined value as the internal temperature distribution of the sample S is made even. The laser flash method can measure a small sample within a short time, uses a simple analytical method, and can perform measurements from room temperature to a high temperature of 200 (° C.) or more. Accordingly, the laser flash method is widely used as a standard practical thermal diffusivity measurement method.

Equation (1) was applied by assuming that the density of GaN was 6.15 (g/cm$^3$) and the specific heat of GaN was 40.8 (J/mol·K) (Barin, I., O. Knaeke, and 0. Kubasehewski, Thermochemical Properties of Inorganic Substrates, Springer-Verlag, Berlin, 1977).

The measurement value of the thermal diffusivity can be corrected by using a standard sample. In this embodiment, polycrystalline alumina (diameter=10 mm and thickness=1 mm) available from JAPAN FINE CERAMICS CENTER was used as a standard sample.

The $t_{1/2}$ method was used as an algorithm for calculating the thermal diffusivity α from the change in back-surface temperature of the sample S. As shown in FIG. 2, the $t_{1/2}$ method calculates the thermal diffusivity α in accordance with equation (2) from the time required to reach the half of the transient temperature rise on the back surface of the sample S. In equation (2), d is the thickness of the sample S.

$$\alpha = 0.1388 d^2 / t_{1/2} \tag{2}$$

A substrate or member made of the GaN-based material according to the present invention is suitable as an epitaxial film growing substrate of a device such as a semiconductor laser, light emitting diode, or electronic device.

Alternatively, a substrate or member made of the GaN-based material according to the present invention is suitable as a mounting member of a device such as a semiconductor laser, light emitting diode, or electronic device.

Figure 3:
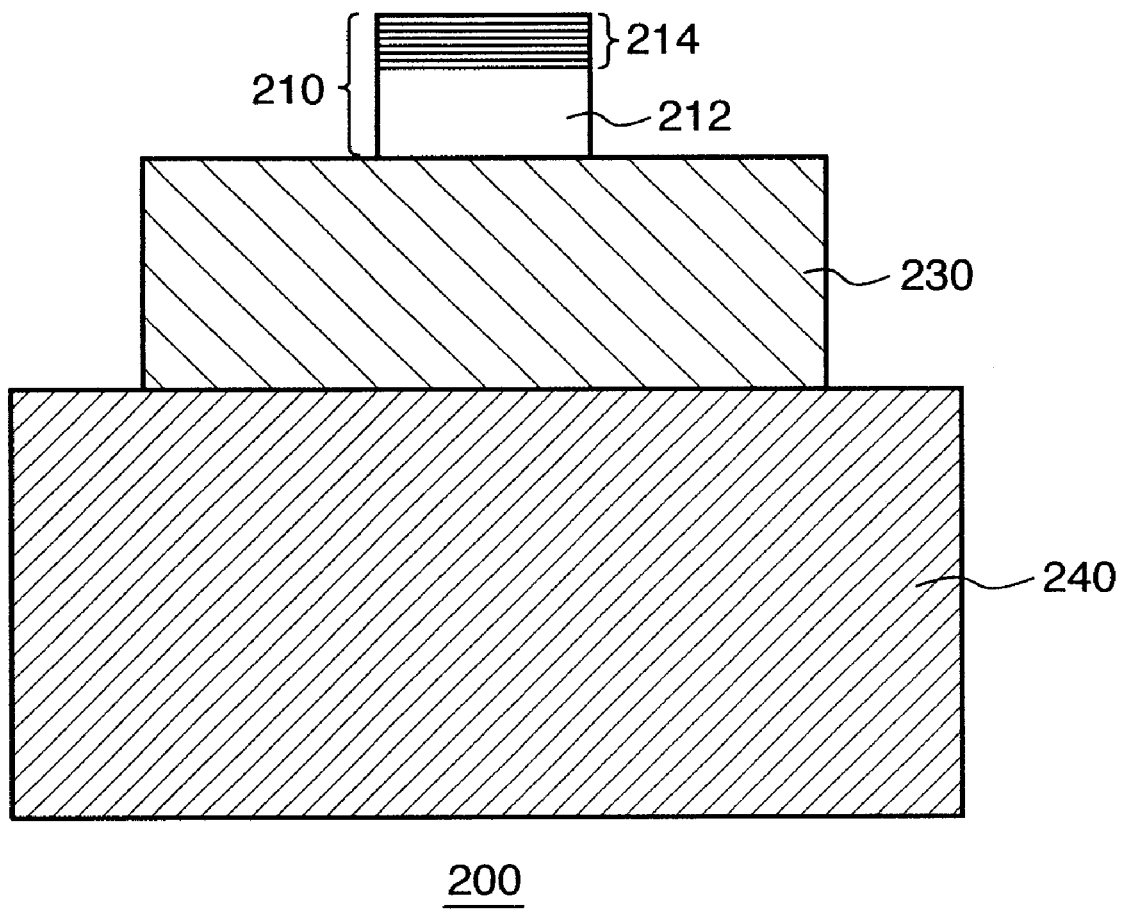
FIG. 3 is a view exemplarily showing the structure of a semiconductor device as an application example of the GaN-based material according to the present invention.
Figure 4:
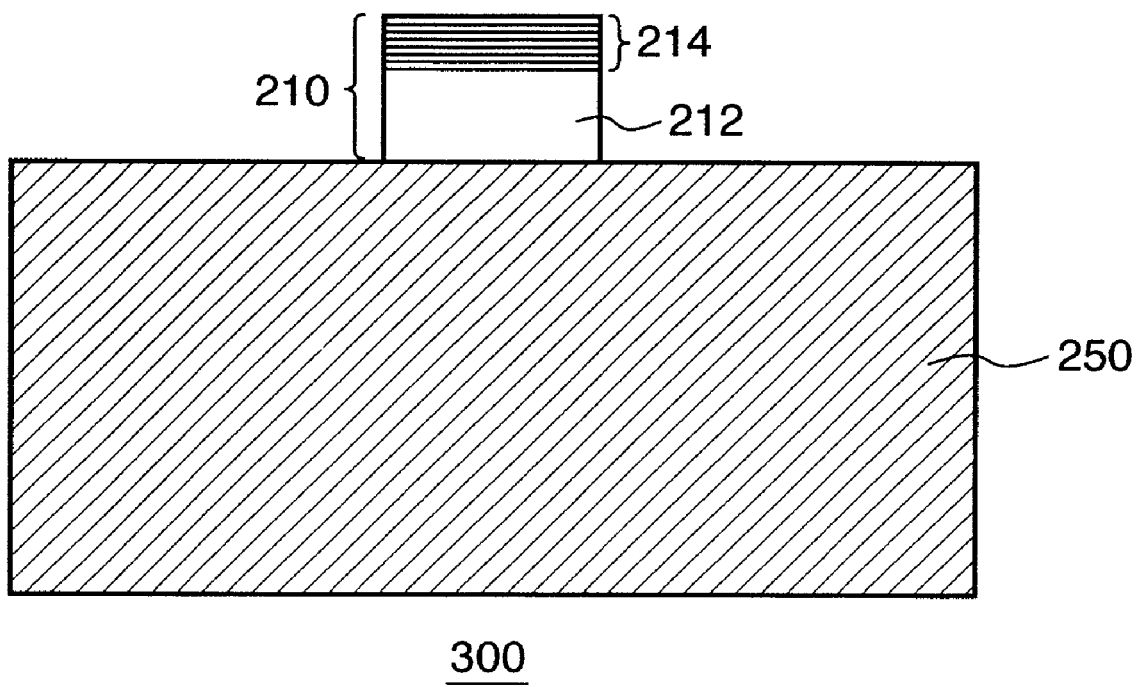
FIG. 4 is a view exemplarily showing the structure of a semiconductor device as an application example of the GaN-based material according to the present invention.

FIGS. 3 and 4 are views exemplarily showing the structures of semiconductor devices as application examples of the GaN-based material according to the present invention. In the application example shown in FIG. 3, a semiconductor product 200 comprises a semiconductor device 210, submount 230, and heat sink 240. The semiconductor device 210 is fixed to the heat sink 240 with the submount 230 being interposed between them. Heat generated by the semiconductor device 210 is transferred to the heat sink 240 via the submount 230, and mainly dissipated from the heat sink 240. Typically, the semiconductor device 210 has a multilayered structure 214 including active layers. The multilayered structure 214 can be supported by, for example, a substrate 212. The substrate 212 is, for example, a template substrate for growing the multilayered structure 214. When the substrate 212 is also made of the gallium nitride-based material having a high thermal conductivity according to the present invention, the heat generated by this semiconductor device can be efficiently transferred through the substrate 212 because the heat is principally generated by the multilayered structure 214 including the active layers. In this application example shown in FIG. 3, a substrate or member made of the GaN-based material according to the present invention can be used as at least one of the substrate 212, submount 230, and heat sink 240.

In the application example shown in FIG. 4, a semiconductor product 300 comprises a semiconductor device 210, and a heat sink 250 fixed to the semiconductor device 210. Heat generated by the semiconductor device 210 is transferred to the heat sink 250 and dissipated from it. Typically, the semiconductor device 210 has a multilayered structure 214 including active layers. The multilayered structure 214 can be supported by, for example, a substrate 212. The substrate 212 is, for example, a template substrate for growing the multilayered structure 214. When the substrate 212 is also made of the gallium nitride-based material having a high thermal conductivity according to the present invention, the heat generated by this semiconductor device can be efficiently transferred through the substrate 212 because the heat is principally generated by the multilayered structure 214 including the active layers. In this application example shown in FIG. 4, a substrate or member made of the GaN-based material according to the present invention can be used as one or both of the substrate 212 and heat sink 250.

In the manufacturing method of the present invention, it is possible to obtain a GaN-based material having a thermal conductivity of 250 (W/m·K) or more at 25 (° C.), and obtain a GaN-based material having a thermal conductivity of 300 (W/m·K) or more or 345 (W/m·K) or more at 25 (° C.) by adjusting the growth conditions. Note that according to non-patent reference 2, the theoretical limit of the thermal conductivity of an ideal GaN crystal is 410 W/m·K.

A GaN-based material having a high thermal conductivity as described above is useful as some or all of the substrate 212, submount 230, and heat sinks 240 and 250. This makes it possible to efficiently dissipate heat generated in the active layers, and suppress the temperature rise in the active layers. This temperature rise suppressing effect is effective to hold the device characteristics or performance (e.g., the optical output) of the device almost constant in constant-current driving or low-voltage driving, and also helps improve the device reliability. A GaN-based material having a high thermal conductivity greatly helps improve the element characteristics and long-term reliability of particularly a high-power device, for example, a light emitting device such as a (super)high-output semiconductor laser or (super)high-luminance light emitting diode, or an electronic device such as a power switching element or high-power, high-frequency electronic element. Also, when a GaN-based material having a high thermal conductivity is used as a support substrate (including a crystal growing substrate), it is possible to achieve element superior in element characteristics and long-term reliability even in junction down assembling.

The term "semiconductor device" can include an electronic device, optical device, and the like. The term "electronic device" can include, for example, a Hall element usable as a position sensor, a microwave field effect transistor (FET), a high electron mobility transistor (HEMT), and a heterojunction bipolar transistor (HBT). The term "optical device" can include a light emitting diode (LED), laser diode (LD), and the like.

A member made of a material such as GaN having a high hardness is preferably divided or shaped by using cleavage, because it is difficult to divide the member by dicing. Since a member made of a single-crystal GaN-based material has a specific crystal plane, a rectangular parallelepiped or cube can be obtained by cleavage.

In the present invention, the crystal system of a GaN-based material formed is desirably a Wultzite structure, although it may also be a cubic system.

Also, in the present invention, a GaN-based material formed desirably has a single-crystal structure, although it may also have a polycrystalline structure. This is so because lattice vibration causes thermal diffusion, and a single-crystal structure has a high thermal diffusion efficiency. In addition, a single-crystal structure can be processed by cleavage or the like by using a specific crystal plane. This makes it possible to obtain a rectangular parallelepiped or cubic member (e.g., a heat sink or submount) relatively easily.

In the growth step, a GaN-based material is grown on an underlying substrate by HVPE. A semiconductor substrate is preferably used as the underlying substrate, although either a semiconductor substrate or dielectric substrate can be used. For example, the underlying substrate is favorably a substrate having a lattice constant close to that of a GaN-based material crystal layer to be grown on the substrate. It is particularly favorable to use a compound semiconductor substrate in which the lattice constant is 0.30 to 0.36 nm in the a-axis direction, and 0.48 to 0.58 nm in the c-axis direction.

Also, the underling substrate desirably has a crystal structure belonging to the cubic system or hexagonal system. As the cubic-system substrate, it is possible to use, for example, Si, GaAs, InGaAs, GaP, InP, ZnSe, ZnTe, or CdTd. As the hexagonal-system substrate, it is possible to use, for example, sapphire, SiC, GaN, spinel, or ZnO.

An off substrate may also be used as the underlying substrate. For example, it is possible to use a sapphire substrate in which the (ABCD) plane or a plane slightly inclined from the (ABCD) plane is a plane used to grow a nitride semiconductor crystal layer. A, B, C, and D indicate natural numbers. The angle of this slight inclination is normally 0° to 10°, preferably 0° to 0.5°, and more preferably 0° to 0.2°. For example, it is possible to favorably use a sapphire substrate slightly inclined in the m-axis direction from the (0001) plane. It is also possible to use the a(11-20) plane, the r(1-102) plane, the m(1-100) plane, planes equivalent to these planes, and planes slightly inclined from these planes. "Equivalent planes" are planes in which the atomic arrangements crystallographically become the same when the planes are rotated 90° in the cubic system or 60° in the hexagonal system.

A GaN-based material can be directly grown on the underlying substrate in accordance with the present invention. However, it is also possible to form an underlying layer on the underlying substrate, and grow a GaN-based material on the underlying layer in accordance with the present invention.

The underlying layer can be formed by, for example, molecular beam epitaxy (MBE), metal organic chemical vapor deposition (MOCVD), PLD (Pulsed Laser Deposition; J. Cryst. Growth, 237/239 (2002) 1153), or HVPE. Of these methods, MBE, MOCVD, and PLD are favorable, and MBE and MOCVD are particularly favorable.

When forming a thin film by MBE, crystal growth can be controlled with accuracy on the molecular-layer level although the growth rate is low, so a layered nitride semiconductor crystal superior in surface properties is obtained. Also, crystal growth can be performed at a relatively low temperature by MBE, the original substrate such as sapphire or zinc oxide can maintain a stable state without being affected by gases used in the formation of an initial nitride semiconductor layer and/or Ga-containing nitride semiconductor crystal layer.

By forming the underlying layer like this, it is possible to improve the crystal state and surface state of a GaN-based material layer grown on the underlying layer.

On the other hand, PLD can grow crystals at a temperature (e.g., room temperature) lower than that of MBE, does not use ammonia gas, and hence is advantageous when using a highly reactive substrate such as sapphire or zinc oxide. Furthermore, apparatuses capable of growing crystals on more than fifty 2-inch substrates at once are available for MOCVD and HVPE. Accordingly, MOCVD and HVPE are very superior in mass-production properties to other growth methods, and have industrial priority over other methods.

The thickness of the underlying layer is not particularly limited, provided that a GaN-based material layer formed on the underlying layer can stably have a good crystallinity and good surface properties. From the viewpoint of productivity, the thickness of the underlying layer is normally 0.1 to 5.0 ($\mu$m), and preferably 0.3 to 2.0 ($\mu$m).

The surface roughness (Ra) of the underlying layer or underlying substrate is preferably 1 (nm) or less, more preferably 0.8 (nm) or less, and further preferably 0.7 nm or less. The surface roughness herein mentioned is the central line average roughness (Ra), and can be obtained by measuring the roughness of the surface by AFM (Atomic Force Microscopy).

A procedure of forming an underlying layer on an underlying substrate made of sapphire, and forming a GaN-based material layer on the underlying layer will be exemplarily explained below.

First, an underlying layer having a thickness of normally 0.1 ($\mu$m) to 5.0 ($\mu$m), and preferably 0.3 ($\mu$m) to 2.0 ($\mu$m) is formed on a sapphire substrate by, for example, MBE, MOCVD, PLD, or HVPE.

Then, a GaN-based material layer is formed on the underlying layer by HVPE in accordance with the present invention. Ga is supplied into the reaction chamber 10 as GaCl gas generated by the reaction between Ga and HCl. A nitrogen material is supplied into the reaction chamber 10 as $NH_3$ gas.

The reaction temperature when generating GaCl by the reaction between Ga and HCl is preferably about 850 (° C.).

After the substrate on which the GaN-based material layer is grown is unloaded from the reaction chamber 10 once and cooled, it is also possible to perform another step such as etching or polishing using an acid or the like, or laser slicing.

A surface treatment such as polishing may also be performed on the surface of the GaN-based material layer as needed.

Furthermore, it is possible to perform steps other than the above steps without departing from the object of the present invention.

Laser lift-off may also be used as a method of removing the GaN-based material layer from the underlying substrate. More specifically, after the GaN-based material layer is grown, a laser is emitted to the interface between the underlying substrate and GaN-based material layer to expose the interface to a high temperature, thereby removing particularly the nitrogen component of gallium nitride. Since, therefore, Ga remaining in the interface can be removed with hydrochloric acid or the like, the underlying substrate can easily be removed.

The underlying substrate can also be removed by the stress generated between the GaN-based material layer and underlying substrate while the temperature is decreased after the layer is grown in a growth apparatus.

Examples of the present invention will be exemplarily explained below.

EXAMPLE 1

A sapphire substrate 430 (μm) in thickness and 2 inches in diameter having a (0001) surface was prepared as an underlying substrate, and cleaned with an organic solvent as pre-preprocessing. After that, an underlying GaN layer having a thickness of 2 (μm) was grown on the underlying substrate by using an MOCVD apparatus.

Subsequently, the substrate having the underlying GaN layer grown on it was placed in the reaction chamber 10 of an HVPE apparatus, and the reaction temperature was raised to 1,070 (° C.). After that, while the carrier gas G1 practically containing only $H_2$, the GaCl gas G2 as the reaction product of Ga and HCl, and the $NH_3$ gas G3 were supplied onto the GaN layer, a GaN layer was grown on the underlying GaN layer for about 15 hrs. In this growth step, the growth pressure was set at $1.01 \times 10^5$ (Pa), the partial pressure of GaCl gas G2 was set at $1.11 \times 10^3$ (Pa), and the partial pressure of the $NH_3$ gas G3 was set at $4.45 \times 10^3$ (Pa).

Then, the sapphire substrate was removed from the substrate on which the GaN layer was grown. In this way, an Si-doped (the carrier concentration: n-type, $4 \times 10^{17}$ (atoms/$cm^3$), the hole measurement value) self-supporting GaN single-crystal substrate about 1,060 (μm) thick was obtained. The oxygen, carbon, and hydrogen impurity concentrations were respectively less than $2 \times 10^{16}$ (atoms/$cm^3$), less than $1 \times 10^{16}$ (atoms/$cm^3$) and less than $1 \times 10^{17}$ (atoms/$cm^3$), that is, all the impurity concentrations were less than the detection limits.

The threading dislocation density measured by CL (Cathode Luminescence) or AFM was $2 \times 10^6$ (dislocations/$cm^2$).

The (002) X-ray rocking curve half-width and (102) X-ray rocking curve half-width of the obtained GaN single-crystal substrate were measured and found to be 62.0 (arcsec) and 98.9 (arcsec), respectively.

After that, a square plate-like GaN single-crystal sample of 10 (mm) side having a thickness of 1 (mm) was formed by polishing and shaping the two surfaces of the obtained GaN single-crystal substrate.

Subsequently, a laser flash measurement sample was formed in order to evaluate the thermal conductivity of the GaN single-crystal sample. More specifically, the laser flash measurement sample was obtained by forming gold films about 200 (nm) thick on the two surfaces of the GaN single-crystal sample, and further forming a carbon film (the thickness was less than 1 μm) on the laser irradiation surface.

The obtained laser flash measurement sample was measured by the laser flash method by using the TC-700 full-automatic laser flash thermal constant measurement apparatus available from ULVAC-RIKO, and the TD-AL thermal diffusivity measurement standard material available from JAPAN FINE CERAMICS CENTER, and $t_{1/2}$ data analysis was performed. Consequently, the thermal diffusivity at room temperature (25° C.) was 127 ($mm^2$/sec).

The thermal conductivity can be obtained in accordance with condition $\lambda = \alpha \times \rho \times C_p$ ($\lambda$: thermal conductivity, $\alpha$: thermal diffusivity, and $C_p$: specific heat capacitance). The calculation was performed by assuming that the density of GaN was 6.15 (g/$cm^3$) and the specific heat of GaN was 40.8 (J/mol·K) (Barin, I., O. Knaeke, and O. Kubasehewski, Thermochemical Properties of Inorganic Substrates, Springer-Verlag, Berlin, 1977). The thermal conductivity of the GaN single crystal obtained by this method was 386 (W/m·K) at room temperature.

EXAMPLE 2

First, a GaN layer was grown on an underlying GaN layer under the same conditions as in Example 1 except that the reaction temperature was set at 1,000 (° C.).

Then, a sapphire substrate was removed from a substrate on which the GaN layer was grown. In this manner, an Si-doped (the carrier concentration: n-type, $4 \times 10^{17}$ (atoms/$cm^3$), the hole measurement value) self-supporting GaN single-crystal substrate about 1,060 (μm) thick was obtained. The oxygen, carbon, and hydrogen impurity concentrations were respectively less than $2 \times 10^{16}$ (atoms/$cm^3$), $2 \times 10^{16}$ (atoms/$cm^3$), and less than $1 \times 10^{17}$ (atoms/$cm^3$), that is, the oxygen and hydrogen concentrations were less than the detection limits.

The threading dislocation density measured by CL (Cathode Luminescence) or AEM was $5 \times 10^6$ (dislocations/$cm^2$).

After that, a square plate-like GaN single-crystal sample of 10 (mm) side having a thickness of 1 (mm) was formed by polishing and shaping the two surfaces of the obtained GaN single-crystal substrate.

Subsequently, to evaluate the thermal conductivity of the GaN single-crystal sample, a laser flash measurement sample was formed following the same procedure as in Example 1.

When the obtained laser flash measurement sample was evaluated in the same manner as in Example 1, the thermal diffusivity at room temperature (25° C.) was 117 ($mm^2$/sec).

The thermal conductivity of the GaN single crystal obtained in the same manner as in Example 1 was 345 (W/m·K) at room temperature.

EXAMPLE 3

First, a GaN layer was grown on an underlying GaN layer under the same conditions as in Example 1 except that the reaction temperature was set at 1,100 (° C.).

Then, a sapphire substrate was removed from a substrate on which the GaN layer was grown. In this way, an Si-doped (the carrier concentration: n-type, $4 \times 10^{17}$ (atoms/$cm^3$), the hole measurement value) self-supporting GaN single-crystal substrate about 1,060 (μm) thick was obtained. The oxygen, carbon, and hydrogen impurity concentrations were respectively less than $2 \times 10^{16}$ (atoms/$cm^3$), less than $1 \times 10^{16}$ (atoms/$cm^3$), and less than $1 \times 10^{17}$ (atoms/$cm^3$), that is, all the impurity concentrations were less than the detection limits.

The threading dislocation density measured by CL (Cathode Luminescence) or AFM was $3 \times 10^6$ (dislocations/$cm^2$).

After that, a square plate-like GaN single-crystal sample of 10 (mm) side having a thickness of 1 (mm) was formed by polishing and shaping the two surfaces of the obtained GaN single-crystal substrate.

Subsequently, to evaluate the thermal conductivity of the GaN single-crystal sample, a laser flash measurement sample was formed following the same procedure as in Example 1.

When the obtained laser flash measurement sample was evaluated in the same manner as in Example 1, the thermal diffusivity at room temperature (25° C.) was 124 (mm$^2$/sec).

The thermal conductivity of the GaN single crystal obtained in the same manner as in Example 1 was 371 (W/m·K) at room temperature.

EXAMPLE 4

A sapphire substrate 430 (μm) in thickness and 2 inches in diameter having a (0001) surface was prepared as an underlying substrate, and cleaned with an organic solvent as pre-preprocessing. After that, an underlying GaN layer having a thickness of 2 (μm) was grown on the underlying substrate by using an MOCVD apparatus.

Subsequently, the substrate having the underlying GaN layer grown on it was placed in the reaction chamber 10 of an HVPE apparatus, and the reaction temperature was raised to 1,070 (° C.). After that, while the carrier gas G1 containing H$_2$ gas and N$_2$ gas at a ratio at which (H$_2$ gas partial pressure)/ ((H$_2$ gas partial pressure)+(N$_2$ gas partial pressure)) was 0.7, the GaCl gas G2 as the reaction product of Ga and HCl, and the NH$_3$ gas G3 were supplied onto the GaN layer, a GaN layer was grown on the underlying GaN layer for about 15 hrs. In this growth step, the growth pressure was set at 1.01× 10$^5$ (Pa), the partial pressure of GaCl gas G2 was set at 1.11×10$^3$ (Pa), and the partial pressure of the NH$_3$ gas G3 was set at 4.45×10$^3$ (Pa). The gas flow rate was 0.931 (m/min) in the supply chamber 40.

Then, the sapphire substrate was removed from the substrate on which the GaN layer was grown. In this way, an Si-doped (the carrier concentration: n-type, 3.5×10$^{17}$ (atoms/ cm$^3$), the hole measurement value) self-supporting GaN single-crystal substrate about 1,643 (μm) thick was obtained. The oxygen, carbon, and hydrogen impurity concentrations were respectively less than 3×10$^{16}$ (atoms/cm$^3$), 5×10$^{16}$ (atoms/cm$^3$), and less than 5×10$^{16}$ (atoms/cm$^3$), that is, the oxygen concentration was less than the detection limit.

The threading dislocation density measured by CL (Cathode Luminescence) or AFM was 5×10$^6$ (dislocations/cm$^2$).

After that, a plate-like GaN single-crystal sample was formed by polishing and shaping the two surfaces of the obtained GaN single-crystal substrate. To evaluate the thermal conductivity of the GaN single-crystal sample, a laser flash measurement sample was formed following the same procedure as in Example 1. When the obtained laser flash measurement sample was evaluated in the same manner as in Example 1, the thermal diffusivity at room temperature (25° C.) was 109 (mm$^2$/sec).

The thermal conductivity of the GaN single crystal obtained in the same manner as in Example 1 was 327 (W/m·K) at room temperature.

EXAMPLE 5

A sapphire substrate 430 (μm) in thickness and 2 inches in diameter having a (0001) surface was prepared as an underlying substrate, and cleaned with an organic solvent as pre-preprocessing. After that, an underlying GaN layer having a thickness of 2 (μm) was grown on the underlying substrate by using an MOCVD apparatus.

Subsequently, the substrate having the underlying GaN layer grown on it was placed in the reaction chamber 10 of an HVPE apparatus, and the reaction temperature was raised to 975 (° C.). After that, while the carrier gas G1 containing H$_2$ gas and N$_2$ gas at a ratio at which (H$_2$ gas partial pressure)/ ((H$_2$ gas partial pressure)+(N$_2$ gas partial pressure)) was 0.1, the GaCl gas G2 as the reaction product of Ga and HCl, and the NH$_3$ gas G3 were supplied onto the GaN layer, a GaN layer was grown on the underlying GaN layer for about 15 hrs. In this growth step, the growth pressure was set at 1.01× 10$^5$ (Pa), the partial pressure of GaCl gas G2 was set at 1.11×10$^3$ (Pa), and the partial pressure of the NH$_3$ gas G3 was set at 4.45×10$^3$ (Pa). The gas flow rate was 0.931 (m/min) in the supply chamber 40.

Then, the sapphire substrate was removed from the substrate on which the GaN layer was grown. In this manner, an Si-doped (the carrier concentration: n-type, 8.9×10$^{17}$ (atoms/ cm$^3$), the hole measurement value) self-supporting GaN single-crystal substrate about 1,271 (μm) thick was obtained. The oxygen, carbon, and hydrogen impurity concentrations were respectively 2×10$^{18}$ (atoms/cm$^3$), 1×10$^{17}$ (atoms/cm$^3$) and 1×10$^{17}$ (atoms/cm$^3$).

The threading dislocation density measured by CL (Cathode Luminescence) or AFM was 5×10$^6$ (dislocations/cm$^2$).

After that, a plate-like GaN single-crystal sample was formed by polishing and shaping the two surfaces of the obtained GaN single-crystal substrate. To evaluate the thermal conductivity of the GaN single-crystal sample, a laser flash measurement sample was formed following the same procedure as in Example 1. When the obtained laser flash measurement sample was evaluated in the same manner as in Example 1, the thermal diffusivity at room temperature (25° C.) was 102 (mm$^2$/sec). The thermal conductivity of the GaN single crystal obtained in the same manner as in Example 1 was 306 (W/m·K) at room temperature.

COMPARATIVE EXAMPLE

A sapphire substrate 430 (μm) in thickness and 2 inches in diameter having a (0001) surface was prepared as an underlying substrate, and cleaned with an organic solvent as pre-preprocessing. After that, an underlying GaN layer having a thickness of 2 (μm) was grown on the underlying substrate by using an MOCVD apparatus.

Subsequently, the substrate having the underlying GaN layer grown on it was placed in a reaction chamber of an HVPE apparatus in which a supply chamber and the reaction chamber had the same sectional area, and the reaction temperature was raised to 1,010 (° C.). After that, while the carrier gas G1 practically containing only N$_2$ gas, the GaCl gas G2 as the reaction product of Ga and HCl, and the NH$_3$ gas G3 were supplied onto the GaN layer, a GaN layer was grown on the underlying GaN layer for about 15 hrs. In this growth step, the growth pressure was set at 1.01×10$^5$ (Pa), the partial pressure of GaCl gas G2 was set at 2.91×10$^2$ (Pa), and the partial pressure of the NH$_3$ gas G3 was set at 1.17×10$^4$ (Pa). The gas flow rate was 0.133 (m/min) in the space above the underlying substrate.

Then, the sapphire substrate was removed from the substrate on which the GaN layer was grown. In this manner, an n-type (the carrier concentration: 9.0×10$^{17}$ (atoms/cm$^3$), the hole measurement value) self-supporting GaN single-crystal substrate about 1,072 (μm) thick was obtained. The oxygen, carbon, and hydrogen impurity concentrations were respectively $1\times10^{19}$ (atoms/cm$^3$), $6\times10^{16}$ (atoms/cm$^3$), and $6\times10^{16}$ (atoms/cm$^3$).

After that, a plate-like GaN single-crystal sample was formed by polishing and shaping the two surfaces of the obtained GaN single-crystal substrate. To evaluate the thermal conductivity of the GaN single-crystal sample, a laser flash measurement sample was formed following the same procedure as in Example 1. When the obtained laser flash measurement sample was evaluated in the same manner as in Example 1, the thermal diffusivity at room temperature (25° C.) was 84.3 (mm$^2$/sec). The thermal conductivity of the GaN single crystal obtained in the same manner as in Example 1 was 253 (W/m·K) at room temperature.

From the foregoing, the present invention can provide a gallium nitride material having a thermal conductivity of $3.0\times10^2$ (W/m·K) or more at 25 (° C.).

In the above samples, the concentration of silicon as an impurity was a relatively high concentration ($4\times10^{17}$ cm$^{-3}$). However, it is presumably possible to further increase the thermal conductivity by decreasing the silicon concentration to $2\times10^{15}$ (atoms/cm$^3$).

In each of the above examples, a GaN-based material having a high thermal conductivity was formed by HVPE. However, it is probably possible to achieve a high thermal conductivity similar to that obtained by HVPE even by the use of another growth method such as the solvothermal method (amonothermal method), liquid phase epitaxy, or metal organic chemical vapor deposition, provided that a GaN-based material is formed such that the impurity concentrations of oxygen, carbon, hydrogen, and silicon fall within the ranges described above.

In the above examples, a high thermal conductivity of gallium nitride has been explained. However, a similar high thermal conductivity is obtained by a gallium nitride (GaN)-based material mainly containing gallium nitride (GaN), or a III-V compound semiconductor material mostly containing gallium (Ga) as a group-III element and nitrogen (N) as a group-V element.

The invention claimed is:

1. A method for producing a gallium nitride-based material, comprising:
locating a support configured to support an underlying substrate in a reaction chamber of a production apparatus;
placing the underlying substrate on the support;
supplying a carrier gas comprising H$_2$ gas, GaCl gas, and NH$_3$ gas to the reaction chamber; and
growing the gallium nitride-based material by Hydride Vapor Phase Epitaxial Growth (HVPE) on the underlying substrate;
wherein
a growth temperature is from 900° C. to 1,200° C.,
a growth pressure is from $8.08\times10^4$ Pa to $1.21\times10^5$ Pa,
a partial pressure of the GaCl gas in the supply gas is from $1.0\times10^2$ Pa to $1.0\times10^4$ Pa,
a partial pressure of the NH$_3$ gas in the supply gas is from $9.1\times10^2$ Pa to $2.0\times10^4$ Pa, and
wherein
the production apparatus consists of a supply chamber in communication with the reaction chamber,
the supply chamber supplies the carrier gas, the GaCl gas, and the NH$_3$ gas to the reaction chamber, and
an average sectional area of the supply chamber is smaller than an average sectional area of the reaction chamber.

2. The method according to claim 1,
wherein the average sectional area of the supply chamber is not more than ⅔ the average sectional area of the reaction chamber.

3. The method according to claim 1, wherein a flow rate of the carrier gas in the supply chamber is from 0.3 m/min to 2.5 m/min.

4. The method according to claim 1, wherein a flow rate of the carrier gas in the supply chamber is from 0.5 m/min to 1.7 m/min.

5. A method for producing a gallium nitride-based material, comprising:
locating a support configured to support an underlying substrate in a reaction chamber of a production apparatus;
placing the underlying substrate on the support;
supplying a carrier gas comprising H$_2$ gas, GaCl gas, and NH$_3$ gas to the reaction chamber; and
growing the gallium nitride-based material by Hydride Vapor Phase Epitaxial Growth (HVPE) on the underlying substrate;
wherein
a growth temperature is from 900° C. to 1,200° C.,
a growth pressure is from $8.08\times10^4$ Pa to $1.21\times10^5$ Pa,
a partial pressure of the GaCl gas in the supply gas is from $1.0\times10^2$ Pa to $1.0\times10^4$ Pa,
a partial pressure of the NH$_3$ gas in the supply gas is from $9.1\times10^2$ Pa to $2.0\times10^4$ Pa, and
wherein
the production apparatus consists of a supply chamber in communication with the reaction chamber,
the supply chamber supplies the carrier gas, the GaCl gas, and the NH$_3$ gas to the reaction chamber, and
an average sectional area of said supply chamber is smaller than a sectional area of said reaction chamber in a section comprising said supporting surface.

6. The method according to claim 5, wherein
the average sectional area of said supply chamber is not more than ⅔ the sectional area of said reaction chamber in the section comprising the supporting surface.

7. The method according to claim 5, wherein a flow rate of the carrier gas in said supply chamber is set to a value ranging from 0.3 m/min to 2.5 m/min.

8. The method according to claim 5, wherein a flow rate of the carrier gas in said supply chamber is set to a value ranging from 0.5 m/min to 1.7 m/min.

9. The method according to claim 1, wherein the carrier gas further comprises N$_2$ gas,
a ratio of (H$_2$ gas partial pressure)/((H$_2$ gas partial pressure)+(N$_2$ gas partial pressure)) is from 0.1 to less than 1, and
a flow rate of the carrier gas in the supply chamber is from 0.3 m/min to 2.5 m/min.

10. The method according to claim 1, wherein the underlying substrate is a semiconductor substrate having a lattice constant of from 0.30 to 0.36 nm in the a-axis direction and a lattice constant of from 0.48 to 0.58 nm in the c-axis direction.

11. The method according to claim 1, wherein the underlying substrate is a semiconductor substrate having a crystal structure of a cubic system or a hexagonal system.

12. The method according to claim 11, wherein the underlying semiconductor substrate has a cubic system crystal structure and is selected from the group consisting of Si, GaAs, InGaAs, GaP, InP, ZnSe, ZnTe and CdTe.

13. The method according to claim 11, wherein the underlying semiconductor substrate has a hexagonal system crystal structure and is selected from the group consisting of sapphire, SiC, GaN, spinel and ZnO.

14. The method according to claim 5, wherein the underlying substrate is a semiconductor substrate having a lattice constant of from 0.30 to 0.36 nm in the a-axis direction and a lattice constant of from 0.48 to 0.58 nm in the c-axis direction.

15. The method according to claim 5, wherein the underlying substrate is a semiconductor substrate having a crystal structure of a cubic system or a hexagonal system.

16. The method according to claim 15, wherein the underlying semiconductor substrate has a cubic system crystal structure and is selected from the group consisting of Si, GaAs, InGaAs, GaP, InP, ZnSe, ZnTe and CdTe.

17. The method according to claim 15, wherein the underlying semiconductor substrate has a hexagonal system crystal structure and is selected from the group consisting of sapphire, SiC, GaN, spinel and ZnO.

18. The method according to claim 5, wherein
the carrier gas further comprises $N_2$ gas,
a ratio of ($H_2$ gas partial pressure)/(($H_2$ gas partial pressure)+($N_2$ gas partial pressure)) is from 0.1 to less than 1, and
a flow rate of the carrier gas in the supply chamber is from 0.3 m/min to 2.5 m/min.

* * * * *